(12) United States Patent
Ziemkowski

(10) Patent No.: US 6,651,323 B2
(45) Date of Patent: Nov. 25, 2003

(54) METHOD FOR MAKING A PRINTED WIRE BOARD HAVING A HEAT-SINKING SOLDER PAD

(75) Inventor: Ted B Ziemkowski, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 196 days.

(21) Appl. No.: 09/851,064

(22) Filed: May 7, 2001

(65) Prior Publication Data

US 2001/0016981 A1 Aug. 30, 2001

Related U.S. Application Data

(62) Division of application No. 09/363,497, filed on Jul. 27, 1999, now Pat. No. 6,294,742.

(51) Int. Cl.$^7$ ................................................. H01R 9/00
(52) U.S. Cl. ..................... 29/843; 29/825; 29/832; 29/840; 29/846; 29/847; 438/612; 438/122; 361/767; 361/774; 361/777; 216/260
(58) Field of Search ..................... 29/825, 846, 847, 29/840, 843, 860, 832; 438/612, 613, 122; 216/13, 20, 17, 41, 105; 174/260; 361/767, 774, 771, 777

(56) References Cited

U.S. PATENT DOCUMENTS

| | | | | | |
|---|---|---|---|---|---|
| 4,766,670 A | * | 8/1988 | Gazdik et al. | ................. | 29/830 |
| 4,804,615 A | * | 2/1989 | Larson et al. | ................. | 430/314 |
| 4,924,352 A | * | 5/1990 | Septfons | ..................... | 361/709 |
| 5,176,811 A | * | 1/1993 | Keim et al. | .................. | 205/164 |
| 5,511,306 A | * | 4/1996 | Denton et al. | ................. | 29/840 |
| 5,733,466 A | * | 3/1998 | Benebo et al. | ................. | 216/13 |

* cited by examiner

Primary Examiner—Carl J. Arbes
Assistant Examiner—Tai Nguyen

(57) ABSTRACT

A method for manufacturing a surface mount solder pad that is adapted to function as a heat sink for an electronic component soldered to the pad. The method comprises a step of providing a printed wiring board having a conductive layer disposed thereon. The method further comprises a step of selecting a size and arrangement of regions of a solder pad so as to sink sufficient heat. The method also comprises removing non-selected regions of the conductive layer to produce solder pads on the surface of the printed wiring board enhanced with features that promote heat transfer to sink enough heat generated by one of the surface mount components to provide for its proper operation.

37 Claims, 6 Drawing Sheets

METHOD FOR MAKING A PRINTED WIRE BOARD HAVING A HEAT-SINKING SOLDER PAD

CROSS-REFERENCE TO RELATED APPLICATION

This is a divisional application of U.S. utility application entitled, "Apparatus and Method for Adapting Surface Mount Solder Pad for Heat Sink Function" having Ser. No. 09/363,497, filed Jul. 27, 1999 now U.S. Pat. No. 6,294,742, which is entirely incorporated herein by reference.

FIELD OF THE INVENTION

The invention is generally directed to surface mount circuit board technology, and more particularly is directed to surface mount solder pads used in circuit boards for electrically interconnecting electronic components.

BACKGROUND OF THE INVENTION

Surface mount circuit board technology provides a number of advantages over older, so called "through-hole" circuit board technology. Such advantages include higher electronic component density, lower costs, and ease of manufacturing. While, surface mount circuit boards provide some advantages, some challenges still remain.

Some electronic components, such as high power transistors, high power devices, and the like benefit from some sort of heat sink to ensure proper intended operation. Even operation of lower power devices may benefit somewhat from use in conjunction with heat sinks. Through-hole circuit boards easily accommodate mounting of separate massive aluminum heat sinks on the circuit boards. However, it is much more difficult to mount such massive aluminum heat sinks on surface mount circuit boards.

Additionally, because of the higher component density employed in surface mount circuit boards, there is less space available for separate heat sinks. Such circuit boards devote a significant amount of space to a large number of surface mount solder pads. The solder pads, typically made of copper or gold, are used for soldering to leads of the electronic components, and are interconnected by conductive circuit traces.

In much of the prior art, surface mount solder pads are made as small as possible, so as to provide for the higher component density. As a general matter, in such cases the solder pads are often no larger than necessary for the soldering.

What is needed is a surface mount solder pad that is adapted to function as a heat sink for an electronic component soldered to the pad.

SUMMARY OF THE INVENTION

The invention provides a surface mount solder pad that is adapted to function as a heat sink for an electronic component soldered to the pad. Accordingly, the invention advantageously provides for reasonably high electronic component density, low cost, and ease of manufacturing, while still providing for proper intended component operation.

Many surface mount components, such as high power surface mount transistors, high power surface mount devices, and the like generate excess heat and therefore benefit from the teachings of the invention. For example, a surface mount component such as a surface mount power MOSFET (Metal Oxide Semiconductor Field Effect Transistors) or the like benefits in that the solder pad of the invention has an enhanced surface area that is sufficiently large (to sink enough excess heat generated by the component) so as to provide for the component's proper intended operation.

In much of the prior art, surface mount solder pads are often no larger than necessary for soldering. However, it should be understood that improper operation such as so called "thermal runaway," as well as component damage could possibly result in some cases, if solder pads are made too small, and the teachings of the invention are not employed.

Briefly and in general terms the method and apparatus of the invention include providing a printed wiring board having solder pads disposed on its surface that are adapted for soldering to leads of surface mount components. The solder pads are electrically interconnected by conductive traces also disposed on the surface. At least one of the solder pads has the enhanced surface area that is selected larger than necessary for the soldering, and that is selected sufficiently large so as to sink enough heat generated by the one of the surface mount components to provide for its proper operation. Such solder pad includes a major surface having features extending into the major surface, so as to provide for the enhanced surface area.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENT

Figure 1A:
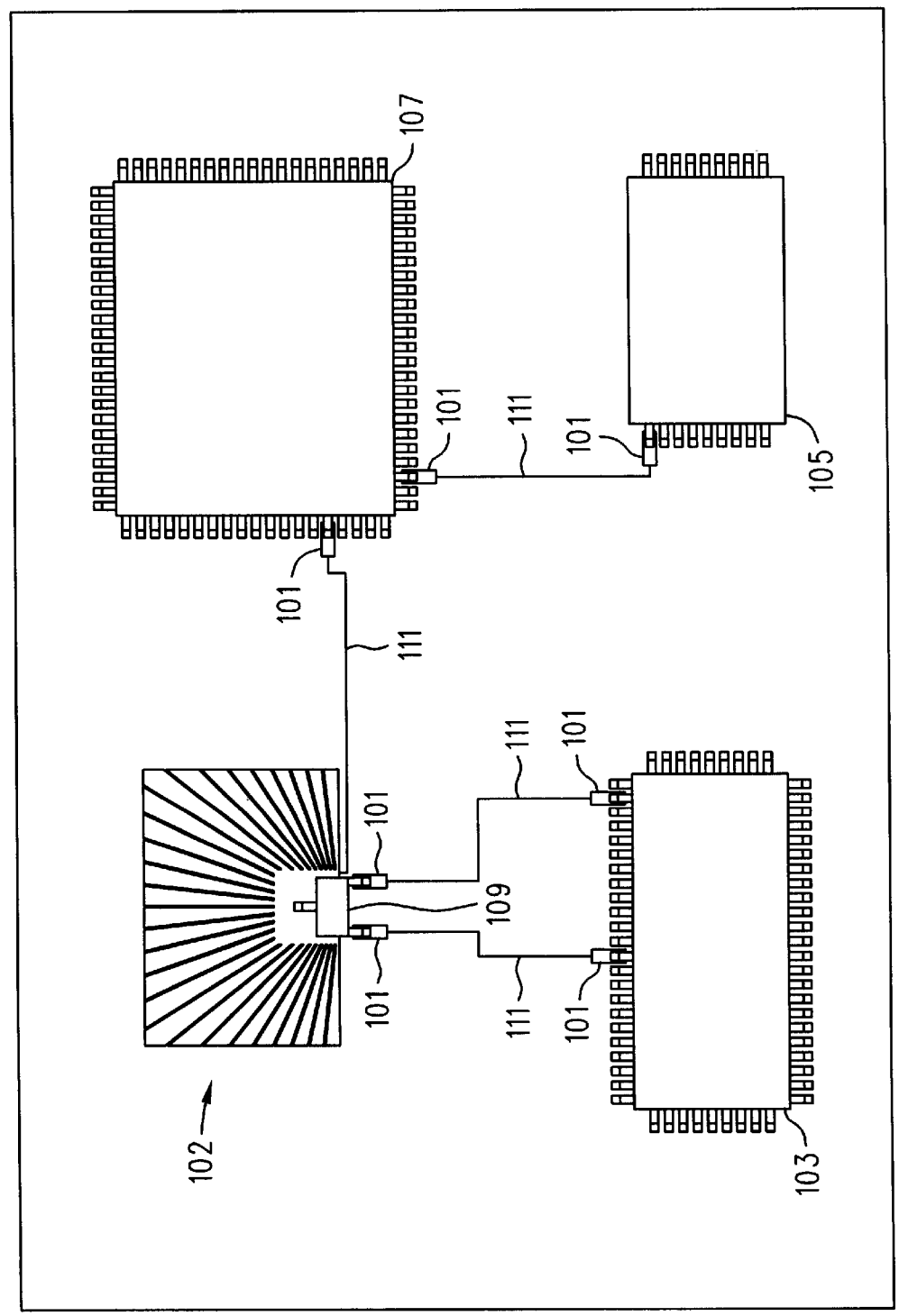
FIG. 1A shows a simplified plan view of a preferred embodiment of the invention.

FIG. 1A shows a simplified plan view of a printed wiring board 100 of a preferred embodiment of the invention. Solder pads 101, 102 are disposed on its surface that are adapted for soldering to leads of surface mount components 103, 105, 107, 109. The solder pads 101, 102 are electrically interconnected by conductive traces 111 also disposed on the surface of the circuit board. For the sake of simplicity, fewer solder pads and components and conductive traces are representatively illustrated in the figures than are employed for the preferred embodiment.

Figure 1B:
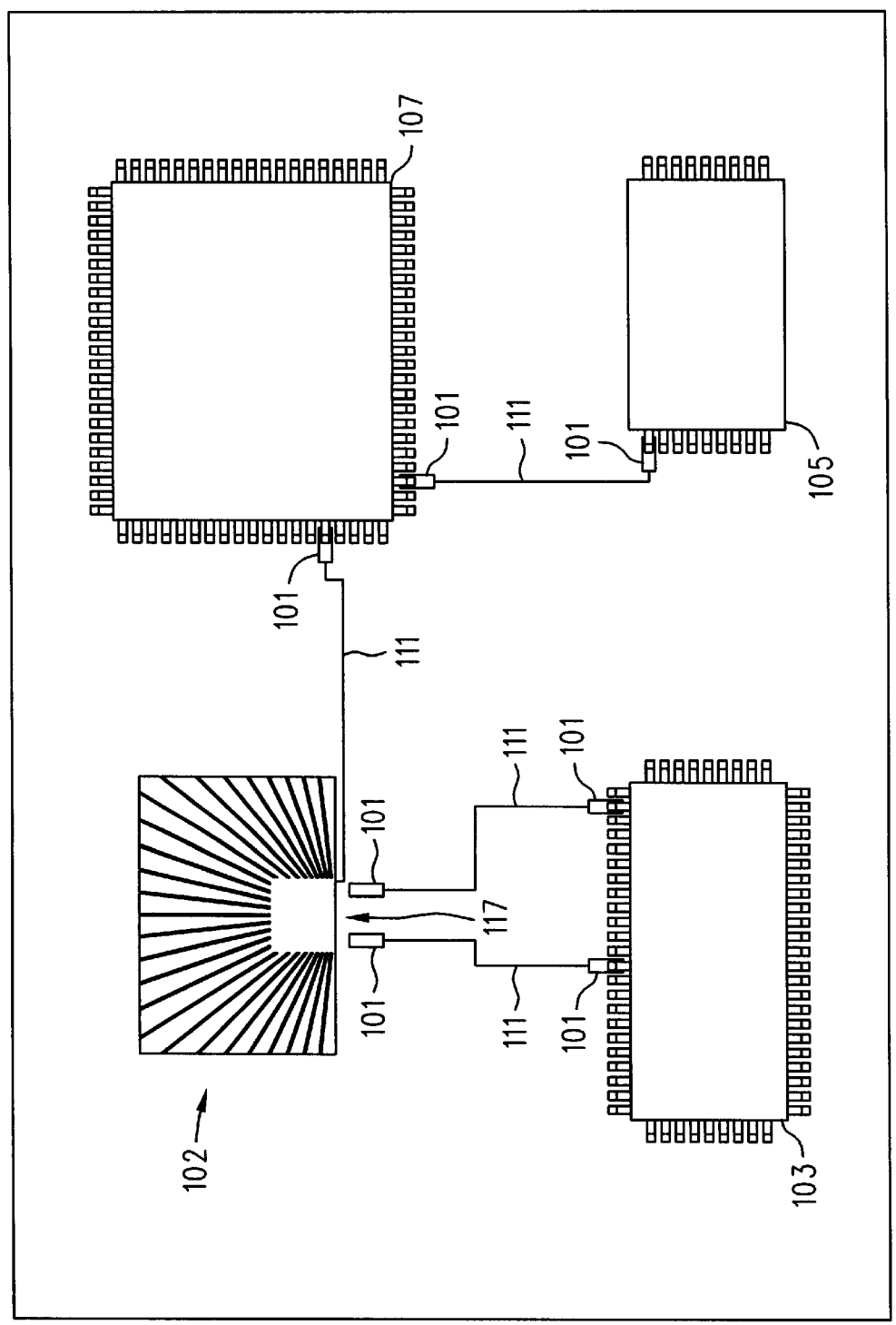
FIG. 1B shows the invention as in FIG. 1A but with one of the surface mount components removed.

The solder pads 101, 102 include at least one solder pad 102 that has an enhanced surface area that is selected larger than necessary for the soldering one of the surface mount components (such as a power MOSFET 109.) The enhanced surface area of the solder pad 102 is selected sufficiently large so as to sink enough heat generated by the power MOSFET 109 so as to provide for its proper intended operation. FIG. 1B shows the invention as in FIG. 1A, but with one of the surface mount components, the power MOSFET 109, removed so as to provide a better view of the enhanced surface area of the solder pad 102.

Figure 2A:
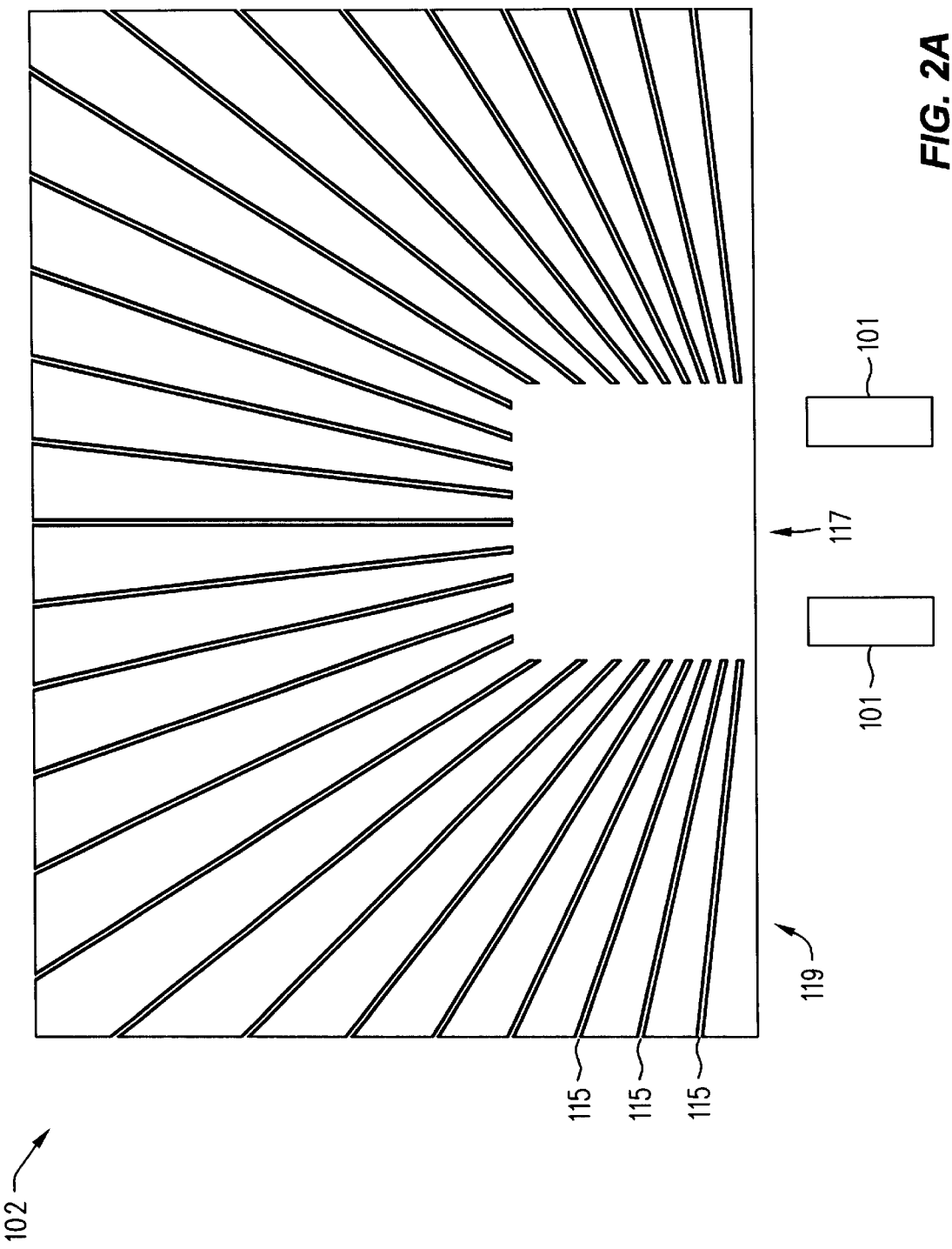
FIG. 2A shows a simplified detailed plan view of a solder pad of the invention having an enhanced surface area.
Figure 2B:
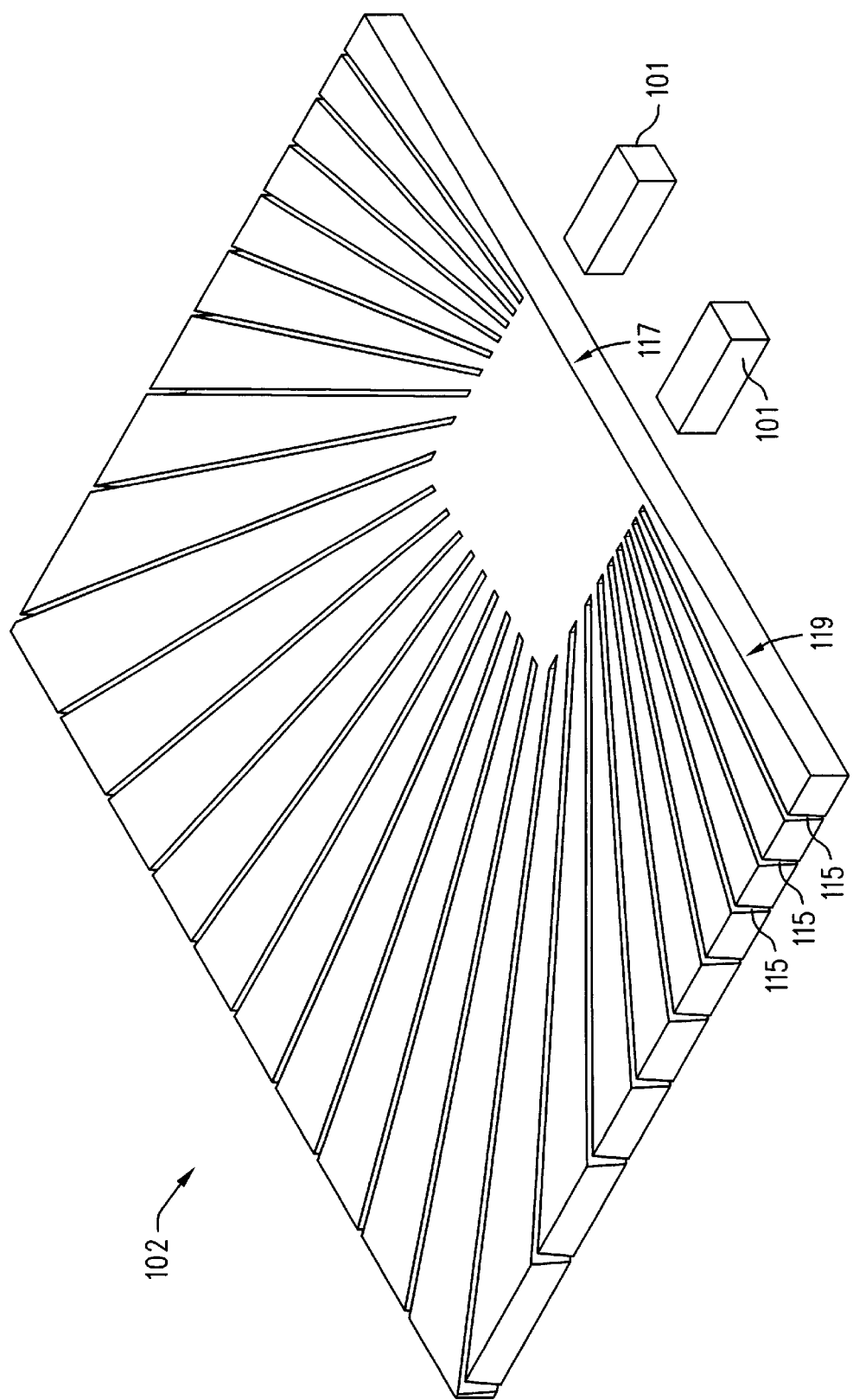
FIG. 2B shows a simplified detailed isometric view of the solder pad shown in FIG. 2A.

FIG. 2A shows a simplified detailed plan view of the solder pad 102 having the enhanced surface area as in FIGS. 1A and 1B. FIG. 2B shows a simplified detailed isometric view of the solder pad 102 of FIG. 2A. As shown in the figures, the solder pad 102 includes a major surface having features extending into the major surface, so as to provide for the enhanced surface area.

In the preferred embodiment, the features are embodied as trenches 115 extending into the major surface, wherein the trenches 115 are arranged extending radially outward from a bonding region 117 of the solder pad 102 though a complementary region 119 of the solder pad 102. As explained in further detail subsequently herein, this radial arrangement of the invention advantageously provides a substantially uniform thermal resistance.

Excess heat generated by the power MOSFET 109 flows through the lead of the MOSFET 109 to where the lead is soldered to the bonding region 117 of the solder pad 102. The radial arrangement of the trenches 115 promotes efficient heat flow by providing substantially uniform thermal resistance as heat flows outwardly from the bonding region 117 through the complementary region 119.

In the preferred embodiment, density of the trenches 115 (extending radially) is substantially within a range from approximately seventy five trenches 115 per one and one half pi radians around the bonding region 117 to approximately six hundred trenches 115 per one and one half pi radians around the bonding region 117. It is theorized by the inventor that if the density is substantially less than approximately seventy five trenches 115 per one and one half pi radians, then the trenches 115 do not sufficiently enhance the surface area of the solder pad 102 to accomplish the purposes of the invention.

While increasing the density of the trenches 115 provides some advantages in further enhancing the surface area of the solder pad 102, it also may make fabrication more difficult. In particular, when the trenches 115 are etched, excessively increasing the density of the trenches 115 leads to over-etching, so that the bonding region is no longer contiguous with some or all the complementary region 119, which in turn substantially impairs the desired heat flow from the bonding region 117 through the complementary region 119. It is theorized by the inventor that if the density is substantially more than approximately six hundred trenches 115 per one and one half pi radians, then significant manufacturing difficulties may result. For the sake of simplicity, a fewer number of trenches 115 and a corresponding lower density are representatively illustrated in the figures.

For similar reasons as those just discussed with respect to trench density, in the preferred embodiment a respective width of each trench 115 is substantially within a range from approximately one mil (0.001 inches) to approximately eight mils (0.008 inches). It is theorized by the inventor that if the trench width is substantially more than approximately eight mils, then the trenches 115 do not sufficiently enhance the surface area of the solder pad 102 for the purposes of the invention discussed previously herein. It is further theorized by the inventor that if the trench width is substantially less than approximately one mil, then significant manufacturing difficulties may result.

Preferably, the solder pad 102 has a thickness dimension substantially within a range from approximately one mil to approximately four mils. It is theorized by the inventor that if the thickness of the solder pad 102 is substantially less than approximately one mil, then manufacturing difficulties may result. It is further theorized by the inventor that if the thickness of the solder pad 102 is substantially more than approximately four mils, then manufacturing costs may increase significantly. In the preferred embodiment, the solder pad 102 has a thickness dimension of approximately two mils, which provides an advantageous balance between manufacturing ease and low cost.

Preferably, the features extend into the major surface an amount substantially within a range from approximately fifty percent to approximately one hundred percent of the thickness dimension of the solder pad 102. It is theorized by the inventor that if the features extend substantially less than approximately fifty percent, then the features do not sufficiently enhance the surface area of the solder pad 102 for the purposes of the invention.

Figure 3:
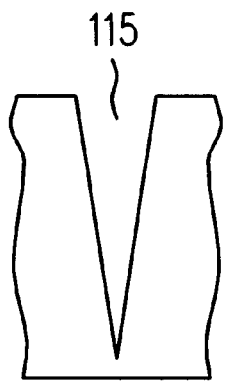
FIGS. 3 and 4 are further detailed cross sectional views, showing features of the invention varied based on etching time.
Figure 4:
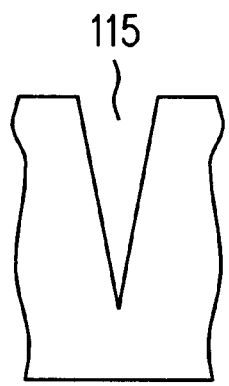

The enhancement of the surface area is maximized as feature extension approaches one hundred percent of pad thickness, as in the preferred embodiment. However manufacturing difficulties, including a risk of over-etching, also increase as feature extension approaches one hundred percent. Accordingly, in another preferred embodiment, the features extend approximately eighty-five percent of the pad thickness, so as to provide for ease of manufacturing. FIGS. 3 and 4 are further detailed cross sectional views, illustrating pad thickness and varied amounts of extension of one of the features 115, based on etching time in accordance with the principles of the invention.

Figure 5:
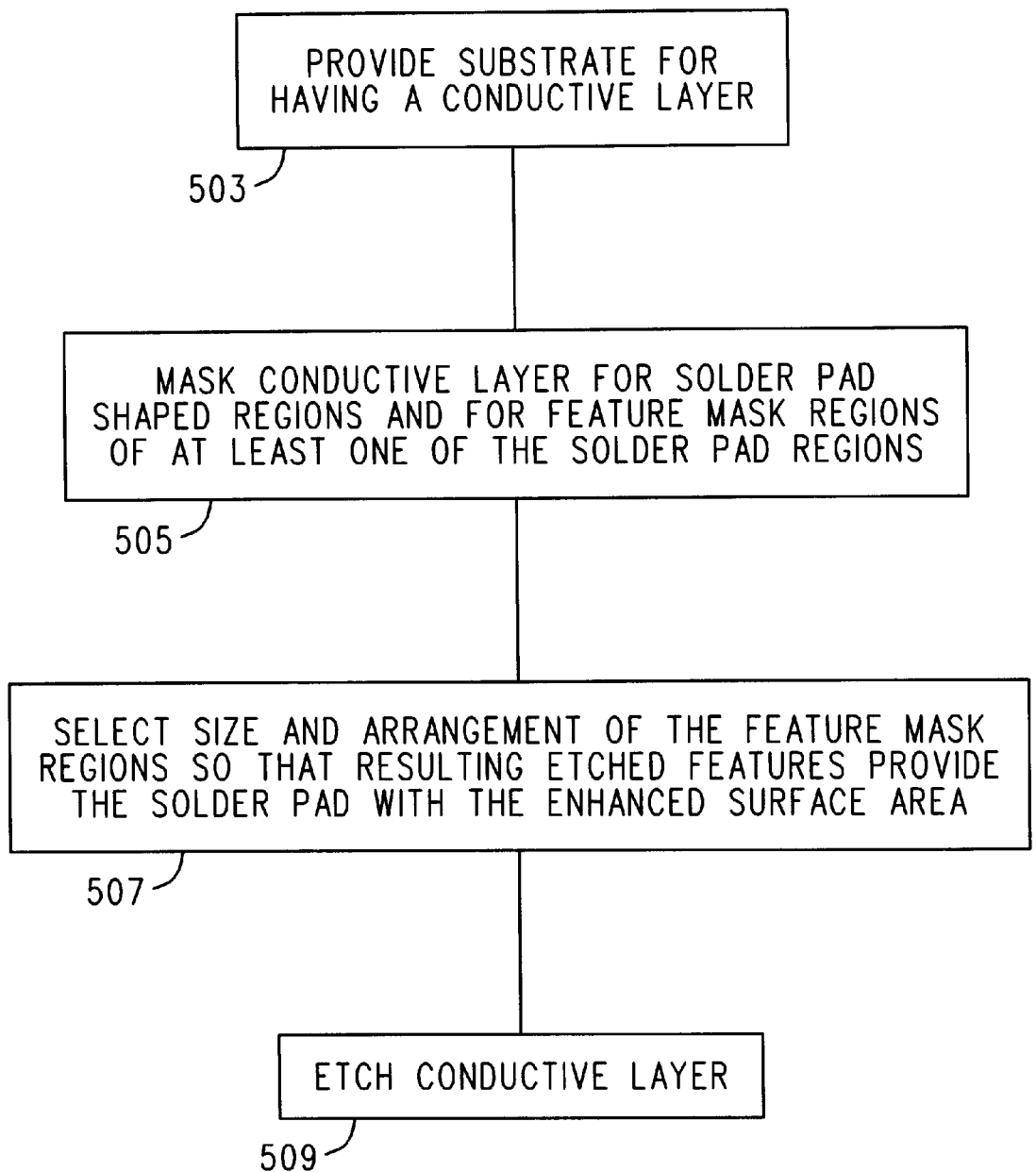
FIG. 5 is a flowchart illustrating a preferred method for making the printed wiring board in accordance with the principles of the invention.

Preferably, in fabricating the printed wiring board 100 having the novel aspects of the invention discussed previously herein, some skills with respect to the use of photoresist, masking and etching that are well known in the art should be leveraged in conjunction with the novel processes of the invention. FIG. 5 is a flowchart illustrating a preferred method 500 for making the printed wiring board 100 in accordance with the principles of the invention.

As shown in block 503 of FIG. 5, a substrate for the printed wiring board 100, for example fiberglass, is provided having a conductive layer disposed thereon, for example a copper layer. As shown in block 505, the conductive layer is masked with photoresist in such a way so as to provide etch resistance to solder pad shaped regions interconnected by conductive trace shaped regions of the conductive layer. This masking step includes masking at least one of the solder pad shaped regions so as to provide etch resistance to feature mask regions within that solder pad region.

As shown in block 507, a size and arrangement of the feature mask regions are selected. As shown in block 509, the masked conductive layer is etched so as to produce the printed wiring board 100 including the solder pads electrically interconnected by conductive traces.

The etching as in block 509 includes etching the features adjacent to the feature mask regions. In block 507, size and arrangement of the feature mask regions are selected so that the resulting etched features provide the solder pad with the enhanced surface area. Preferably, the etching is done for a sufficiently short period of time to avoid over-etching, so that the bonding region of the solder pad, adjacent to the features, remains contiguous with the complementary region of the solder pad. Additionally, it is preferred that etching is done for a sufficiently long period of time so that the features extending into the major surface of the solder pad extend approximately eighty five percent through the thickness of the solder pad.

For example, in one of the preferred embodiments: the major surface of the solder pad 102, into which the features extend, measures approximately one inch by approximately one inch; the solder pad 102 is made of copper approximately two mils thick; the preferred features of approximately one hundred and fifty trenches 115 each having a width of approximately one and one half mils are radially arranged, having a density of approximately one hundred and fifty trenches 115 per one and one half pi radians around the bonding region; and the solder pad is etched in an etchant bath of an aqueous solution including approximately thirty percent ammonia (or other suitable commercially available etchant), at a bath temperature of approximately one hundred and twenty four degrees Fahrenheit, for a time period of approximately one and a half minutes. It is theorized by the inventor that under these conditions, this time period is sufficiently short so as to avoid over-etching, but is sufficiently long so that the trenches 115 extend approximately eighty five percent through the thickness of the solder pad 102.

Under these conditions, it is estimated that the one hundred and fifty trenches 115 advantageously enhance the surface area of the solder pad 102 by approximately sixteen percent, so as to enhance cooling efficiency as the solder pad 102 is adapted to function as a heat sink. For example, where the surface mount component is a Motorola MTp 3055VL surface mount power n-channel MOSFET 109, generating approximately one and three quarters Watts of excess heat during operation, under these conditions the enhanced surface area of the solder pad is sufficiently large (to sink enough excess heat generated by the component) so as to provide for the components proper intended operation (in this case, undamaged operation) at ambient room temperature.

It should be understood that although the etching as in block 509 is preferably kept as simple as possible, within the scope of the invention the etching in block 509 is construed broadly in light of modem printed circuit board fabrication techniques. Accordingly, in some embodiments the etching in block 509 broadly includes techniques that break etching down into various combinations of sub-steps of etching in the etchant bath and back-plating in a plating bath.

As fully discussed previously herein, the invention provides a surface mount solder pad that is adapted to function as a heat sink for an electronic component soldered to the pad. Although specific embodiments of the invention have been described and illustrated, the invention is not to be limited to the specific forms or arrangements of parts so described and illustrated, and various modifications and changes can be made without departing from the scope and spirit of the invention. For example, the invention is not strictly limited to radial trench features. It is theorized by the inventor that alternative arrangements and feature shapes such as those having circular or "polka-dot" cross sections and extending into the major surfaces of the solder pad may be employed with beneficial results. Within the scope of the appended claims, therefore, the invention may be practiced otherwise than as specifically described and illustrated.

What is claimed is:

1. A method for making a printed wiring board having solder pads that are adapted for soldering to leads of surface mount components, comprising the steps of:
   providing a substrate having a conductive layer disposed thereon;
   masking the conductive layer in such a way so as to provide etch resistance to solder pad shaped regions interconnected by conductive trace shaped regions of the conductive layer, wherein the masking step includes masking at least one of the solder pad shaped regions so as to provide etch resistance to feature mask regions within the said at least one of the solder pad regions;
   selecting a size and arrangement of the feature mask regions, wherein the selecting step includes selecting size and arrangement of the feature mask so that the resulting etched features provide at least one of said solder pads with an enhanced surface area that is sufficiently large so as to sink sufficient heat generated by one of the surface mount components, so as to provide for a proper operation; and
   etching the masked conductive layer so as to produce the printed wiring board including the solder pads electrically interconnected by conductive traces, each disposed on the surface of the substrate, wherein the etching step includes etching features adjacent to the feature mask regions and extending into a major surface of at least one of the solder pads.

2. A method as in claim 1 wherein the etching step includes etching for a sufficiently short period of time so that a bonding region of the solder pad, adjacent to the features, remains contiguous with a complementary region of the solder pad.

3. A method as in claim 2 wherein the etching step includes etching for a sufficiently long period of time so that the features extending into the major surface of the solder pad extend approximately one hundred percent through the thickness of the solder pad.

4. A method as in claim 1 wherein the etching step includes etching for a period of time such that the features extending into the major surface of the solder pad extend approximately from fifty percent to approximately one hundred percent of the thickness of the solder pad.

5. A method as in claim 1 wherein the etching step includes etching for a period of time such that the features extend into the major surface of the solder pad an amount of approximately eighty-five percent.

6. A method as in claim 1 wherein the etching step includes etching in such a manner that the features extending into the major surface of the solder pad extend radially outward from a bonding region of the solder pad through a complementary region of the solder pad.

7. A method as in claim 6 wherein the radially extending features are arranged so as to provide a substantially uniform thermal resistance for heat flowing outward from the bonding region through the complementary region.

8. A method as in claim 1 wherein the etching step includes etching in such a manner that the major surface of the solder pad has trenched features extend radially outward from a bonding region of the solder pad and wherein a density of the radially extending features is substantially within a range from approximately seventy-five trenches per one and one half pi radians around the bonding region to approximately six hundred trenches per one and one half pi radians around the bonding region.

9. A method as in claim 1 wherein the etching step includes etching in such a manner that the major surface of the solder pad has trenched features extending radially outward from a bonding region of the solder pad and wherein a density of the radially extending features is substantially within a range from approximately one hundred and fifty trenches per one and one half pi radians around the bonding region.

10. A method as in claim 1 wherein the etching step includes etching for a period of time such that the features extending into the major surface of the solder pad have a width of approximately one mil to approximately eight mils.

11. A method as in claim 1 wherein the conductive layer is masked in such a way that the solder pad shaped regions interconnected by conductive trace shaped regions of the conductive layer are resolved during the etching step.

12. A method as in claim 1 wherein the conductive layer is masked in such a way so as to provide etch resistance for the solder pad shaped regions.

13. A method as in claim 1 wherein the masking of the conductive is configured to create a solder pad surface of sufficient size and arrangement to accommodate the surface mount components.

14. A method as in claim 1 wherein the solder pad is comprised of a conductive material and the etching material is comprised of an aqueous solution of ammonia.

15. A method as in claim 1 wherein the solder pad is comprised of copper and the etching material is comprised of an aqueous solution of 30% ammonia.

16. A method as in claim 1 wherein the solder pad is comprised of a first conductive material and the remaining conductive elements of the printed wiring board are comprised of a second conductive material.

17. A method for making a printed wiring board, the method comprising the steps of:
   providing a substrate having a conductive layer disposed thereon;
   selecting a size and arrangement of features, solder pads and conductive trace shaped regions on the conductive layer; and
   removing non-selected regions of the conductive layer so as to produce a printed wiring board including solder pads and conductive traces disposed on a surface of the substrate, the solder pads being connected to the conductive traces, at least one solder pad used as a heat sink when attached to a lead of a surface mount component.

18. A method as in claim 17 wherein the removing step includes chemically removing sufficient material so that a bonding region of the solder pad, adjacent to the features, remains contiguous with a complementary region of the solder pad.

19. A method as in claim 17 wherein the removing step includes mechanically removing sufficient material so that a bonding region of the solder pad, adjacent to the features, remains contiguous with a complementary region of the solder pad.

20. A method as in claim 17 wherein the removing step includes removing sufficient material so that the features extend into a major surface of the solder pad and said features extend approximately one hundred percent through the thickness of the solder pad.

21. A method as in claim 17 wherein the removing step includes removing sufficient material so that the features extend into a major surface of the solder pad and said features extend approximately from fifty percent to approximately one hundred percent of the thickness of the solder pad.

22. A method as in claim 17 wherein the removing step includes removing sufficient material such that the features extend into a major surface of the solder pad an amount of approximately eighty-five percent.

23. A method as in claim 17 wherein the removing step includes removing sufficient material such that the features extend into a major surface of the solder pad and extend radially outward from a bonding region of the solder pad through a complementary region of the solder pad.

24. A method as in claim 23 wherein the radially extending features are arranged so as to provide a substantially uniform thermal resistance for heat flowing outward from the bonding region through the complementary region.

25. A method as in claim 17 wherein the removing step includes removing sufficient material in such a manner that the features acquire a trenched appearance in a major surface of the solder pad.

26. A method as in claim 17 wherein the removing step includes removing sufficient material in such a manner that the features acquire a circular appearance.

27. A method as in claim 25 wherein the removing step includes removing sufficient material in such a manner that the trenched features of the major surface extend radially outward from a bonding region of the solder pad and wherein a density of the radially extending features is substantially within a range from approximately seventy-five trenches per one and one half pi radians around the bonding region to approximately six hundred trenches per one and one half pi radians around the bonding region.

28. A method as in claim 17 wherein the removing step includes removing sufficient material in such a manner that a major surface of the solder pad has trenched features extending radially outward from a bonding region of the solder pad and wherein a density of the radially extending features is substantially within a range from approximately one hundred and fifty trenches per one and one half pi radians around the bonding region.

29. A method as in claim 17 wherein the removal of the non-selected regions of a conductive layer resolves the selected solder pad shaped regions interconnected by conductive trace shaped regions of the conductive layer.

30. A method as in claim 29 wherein the removal of the non-selected regions of the conductive layer creates a solder pad surface of sufficient size and arrangement to accommodate surface mount components.

31. A method for manufacturing a printed wiring board, the method comprising the steps of:
   providing a substrate having a mounting surface;
   forming solder pads on the mounting surface of the substrate, each solder pad having a connection surface for connection with a lead of a first surface mount component; and
   forming an enhanced solder pad on the mounting surface of the substrate, the enhanced solder pad having a heat sinking surface that is larger than the connection surface;
   connecting a first portion of the heat sinking surface to a lead of a second surface mount component.

32. The method of claim 31, further comprising the step of soldering the leads of the first surface mount component to the solder pads and soldering at least one lead of the second surface mount component to the enhanced solder pad.

33. The method of claim 31, wherein the step of forming the enhanced solder pad further comprises the step of forming trenches in a second portion of the heat sinking surface.

34. The method of claim 33, wherein the step of forming trenches in the second portion of the heat sinking surface further comprises forming trenches in order to provide uniform thermal resistance.

35. The method of claim 34, wherein the step of forming trenches in order to provide uniform thermal resistance further comprises the step of forming radially-extending trenches that extend outward from a lead-connection point on the first portion of the heat sinking surface of the enhanced solder pad.

36. The method of claim 33, wherein the step of forming trenches in the second portion of the heat sinking surface further comprises etching trenches with such a width, depth, and radial density so as to sink sufficient heat generated by the second surface mount component to allow proper operation of the second surface mount component.

37. The method of claim 31, wherein the first surface mount component and the second surface mount component are the same component.

* * * * *